(12) United States Patent
Caspary et al.

(10) Patent No.: US 7,244,638 B2
(45) Date of Patent: Jul. 17, 2007

(54) SEMICONDUCTOR MEMORY DEVICE AND METHOD OF PRODUCTION

(75) Inventors: Dirk Caspary, Dresden (DE); Stefano Parascandola, Dresden (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 11/241,820

(22) Filed: Sep. 30, 2005

(65) Prior Publication Data

US 2007/0075335 A1 Apr. 5, 2007

(51) Int. Cl.
*H01L 21/82* (2006.01)
*H01L 31/62* (2006.01)

(52) U.S. Cl. .................. 438/128; 257/390
(58) Field of Classification Search ............. 257/315, 257/390, 411, 692; 438/128–130, 275, 591
See application file for complete search history.

(56) References Cited

U.S. PATENT DOCUMENTS 6,445,046 B1   9/2002 Hofmann et al.

2003/0234449 A1   12/2003 Aratani et al.
2005/0029681 A1   2/2005 Ishii et al.
2005/0189570 A1   9/2005 Nomoto et al.

FOREIGN PATENT DOCUMENTS

DE   196 52 547 A1   6/1998

*Primary Examiner*—Calvin Lee
(74) *Attorney, Agent, or Firm*—Slater & Matsil, L.L.P.

(57) ABSTRACT

Final sections of the word lines are arranged in a staggered fashion to fan out and have larger lateral extensions than the word lines. Interspaces are filled with a dielectric material, and a mask is applied that partially covers the final sections and leaves contact areas in regions adjacent to the final sections and to the interspaces open. This mask is used to remove the dielectric material between the word line stacks. A second word line layer is applied and planarized to form second word lines between the first word lines, which have contact areas arranged in a staggered fashion to fan out like the final sections of the first word lines.

21 Claims, 5 Drawing Sheets

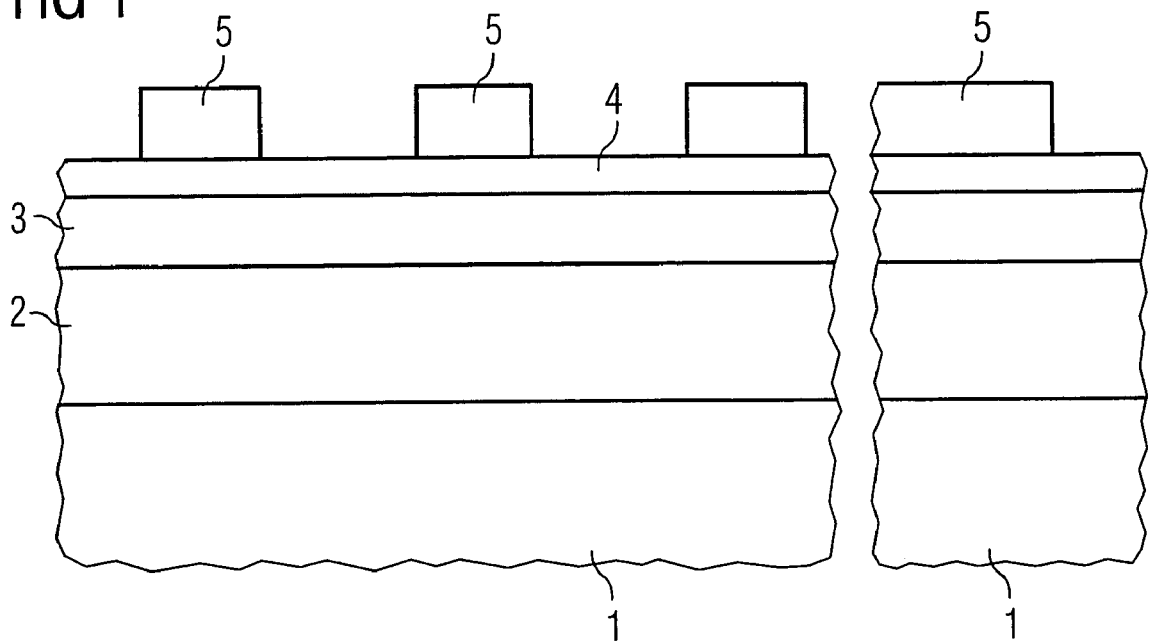
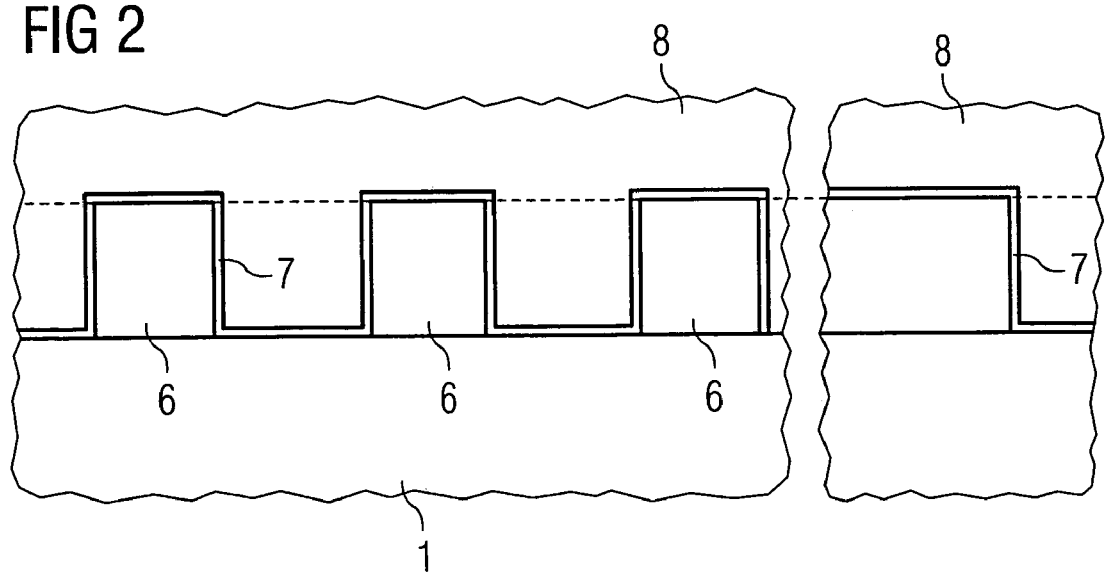

SEMICONDUCTOR MEMORY DEVICE AND METHOD OF PRODUCTION

TECHNICAL FIELD

This invention concerns semiconductor memory devices, e.g., those comprising word lines that are arranged in minimal pitch.

BACKGROUND

Semiconductor memory devices comprise arrays of memory cells that are arranged in rows and columns. The gate electrodes of rows of memory cell transistors are connected by word lines, by which the memory cells are addressed. The word lines are shaped as word line stacks, which are arranged in parallel. The word lines are electrically insulated from one another laterally by dielectric material. Each word line is provided with a contact area at an end of the word line in a peripheral area. The contact areas have a larger lateral dimension than the striplike word line stacks. Therefore, the contact areas are arranged in a staggered fashion.

The lateral distance between two word line stacks and the width of the word line stacks sum to the pitch of the array of word lines. The pitch is the dimension of the periodicity of a periodic pattern or arrangement. The word line stacks succeed one another in a completely periodic fashion, in order to reduce the necessary device area as much as possible. If the word line array is structured by a usual photolithography technique, the lateral dimensions of the word line stacks and the width of the intermediate spaces can only be produced with the minimal value that is enabled by the applied photolithography, and the minimal possible pitch of the word line array is limited.

SUMMARY OF THE INVENTION

In one aspect, this invention provides a semiconductor memory device with an array of word line stacks or bit line stacks having a smaller pitch than has heretofore been possible.

Further aspects of the invention show how such a semiconductor memory device can be provided with contact areas to each single word line stack or bit line stack.

Embodiments of the invention further describe methods of production of semiconductor memory devices by which the smaller pitch of the word line stacks or bit line stacks can be realized by an application of standard photolithography.

The semiconductor memory device according to a first embodiment of this invention is provided with an improved arrangement of contact areas of the conductor tracks that are provided to address the memory cells, especially word lines or bit lines. Final sections of the conductor tracks are arranged in a staggered fashion to fan out and have larger lateral extensions than the conductor tracks. Interspaces are filled with a dielectric material, and a mask is applied that partially covers the final sections and leaves contact areas in regions adjacent to the final sections and to the interspaces open. This mask is used to remove the dielectric material between the conductor tracks so that a blocking layer remains, which delimits the final regions of second conductor tracks. An electrically conductive material is applied and planarized to form second conductor tracks between the first conductor tracks, the second conductor tracks having contact areas that are arranged in a staggered fashion to fan out like the final sections of the first conductor tracks.

A first embodiment of the semiconductor memory device includes a substrate with a main surface. An array of memory cells has edges and is arranged on the main surface. Conductor tracks, like word lines or bit lines, are arranged in parallel across the array. The conductor tracks have a longitudinal extension and a lateral dimension, according to the two-dimensional extension of the array, and are separated from one another by dielectric material. The conductor tracks are provided with contact areas having a dimension transversely to the longitudinal extension that is larger than the lateral dimension of the conductor tracks themselves. The conductor tracks are subdivided into pluralities, which comprise every next but one conductor track. The contact areas of the conductor tracks of the same plurality are located on the same edge of the memory cell array. The contact areas of the conductor tracks of at least one plurality are arranged in a staggered fashion in the direction of the longitudinal extension of the conductor tracks. The contact areas of this plurality are shifted in a direction transverse to the longitudinal extension out of an area that is defined by a straight prolongation of the area of the pertaining conductor track in the direction of the longitudinal extension.

A second embodiment of the semiconductor memory device includes a substrate with a main surface. An array of memory cells is arranged at the main surface. Conductor tracks, like word lines or bit lines, are provided to address the memory cells. Each of the conductor tracks has a longitudinal extension and a lateral dimension and is separated from one another by dielectric material. The conductor tracks are provided with contact areas having a dimension transversely to the longitudinal extension that is larger than the lateral dimension. The conductor tracks are subdivided into pluralities, which comprise every next but one conductor track. The contact areas of the conductor tracks of the same plurality are located on the same edge of the memory cell array. The contact areas of the conductor tracks of at least one plurality are arranged in a staggered fashion so that the contact areas are successively located at an increasing distance from the memory cell array.

One plurality of conductor tracks may comprise contact areas on one edge of the memory cell array and another plurality of conductor tracks comprise contact areas on an opposite edge of the memory cell array. Instead, all the contact areas can be arranged on the same edge of the array. The contact areas belonging to the same plurality of conductor tracks are preferably arranged in a staggered fashion so that they are successively located at an increasing distance from the memory cell array.

A third embodiment of the semiconductor memory device additionally includes the features that the contact areas of two pluralities of conductor tracks are arranged on opposite edges of the memory cell array. The conductor tracks of the first plurality each include an end that is provided with one of the contact areas on one edge of the memory cell array and an opposite end that is located on the opposite edge of the memory cell array. The opposite ends are arranged in staggered fashion so that they are successively located at an increasing distance from the memory cell array. The contact areas of the conductor tracks of the second plurality are arranged on the opposite edge and in a staggered fashion according to the staggered arrangement of the opposite ends of the conductor tracks of the first plurality. The contact areas of the conductor tracks of the second plurality are shifted in a direction transverse to the longitudinal extension of the conductor tracks out of an area that is defined by a straight prolongation of the area of the pertaining conductor track of the second plurality in the direction of the longitudinal extension.

In a method to produce this semiconductor memory device, a semiconductor body, e.g., a substrate, has a main surface. An array of memory cells is provided at the main surface. A first plurality of parallel conductor tracks is arranged on the surface across the array. The conductor tracks are separated by interspaces and are provided with contact areas on one of the edges of the memory cell array. A blocking layer is formed on the surface. The blocking layer has an opening that delimits an area provided for a second plurality of parallel conductor tracks that are to be arranged in the interspaces and for appertaining contact areas on one of the edges of the memory cell array. Lateral insulations are applied to the first plurality of conductor tracks and an electrically conductive material is applied into the opening of the blocking layer to form the second plurality of conductor tracks and contact areas. The blocking layer is preferably an oxide derived from tetraethylorthosilicate (TEOS).

In a further example, an array of memory cells is provided at a main surface of a semiconductor body. A first plurality of conductor tracks are provided with longitudinal extensions running parallel at a distance from one another across the array. The conductor tracks are provided with final sections. A dielectric material is applied to fill spaces between the conductor tracks. The dielectric material is planarized to a top level of the conductor tracks. A mask partially covers the final sections and leaves the conductor tracks and interspaces between the conductor tracks free, as well as areas that are adjacent to the final sections and to final sections of the interspaces. The dielectric material is removed in the areas that are left free by the mask. A lateral electric insulation is applied to the first plurality of conductor tracks. A material provided for a second plurality of conductor tracks is filled into the interspaces and into the areas that are adjacent to the final sections of the interspaces, and providing the final sections of the interspaces with dimensions that are suitable for contact areas.

The method may include additional steps, such as, forming the conductor tracks of the first plurality with a longitudinal extension and with ends on one edge of the memory cell array. The ends can be arranged in staggered fashion so that they are successively located at an increasing distance from the memory cell array. The opening of the blocking layer can be formed to encompass areas that are laterally adjacent to the ends of the conductor tracks of the first plurality, with respect to their longitudinal extension. These laterally adjacent areas can be contact areas of the conductor tracks of the second plurality.

Preferably, the ends of the conductor tracks of the first plurality are formed to have lateral extensions that are located at increasing distance from the memory cell array, when taken in their succession from one conductor track of the first plurality to the next conductor track of the first plurality, and the contact areas of the conductor tracks of the second plurality are arranged between these lateral extensions. The lateral extensions of the ends of the conductor tracks of the first plurality can be provided as contact areas of the conductor tracks of the first plurality.

In a further example of the method, the conductor tracks of the first plurality with further ends are formed on an opposite edge of the memory cell array. The further ends are arranged in staggered fashion so that they are successively located at an increasing distance from the memory cell array. The further ends are provided with further lateral extensions to form the contact areas of the conductor tracks of the first plurality.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a cross-section of a first intermediate product of the production method after the application of a resist mask;

FIG. 2 shows the cross-section according to FIG. 1 after the formation of word line stacks and an application of a cover layer of dielectric material;

Figure 3:
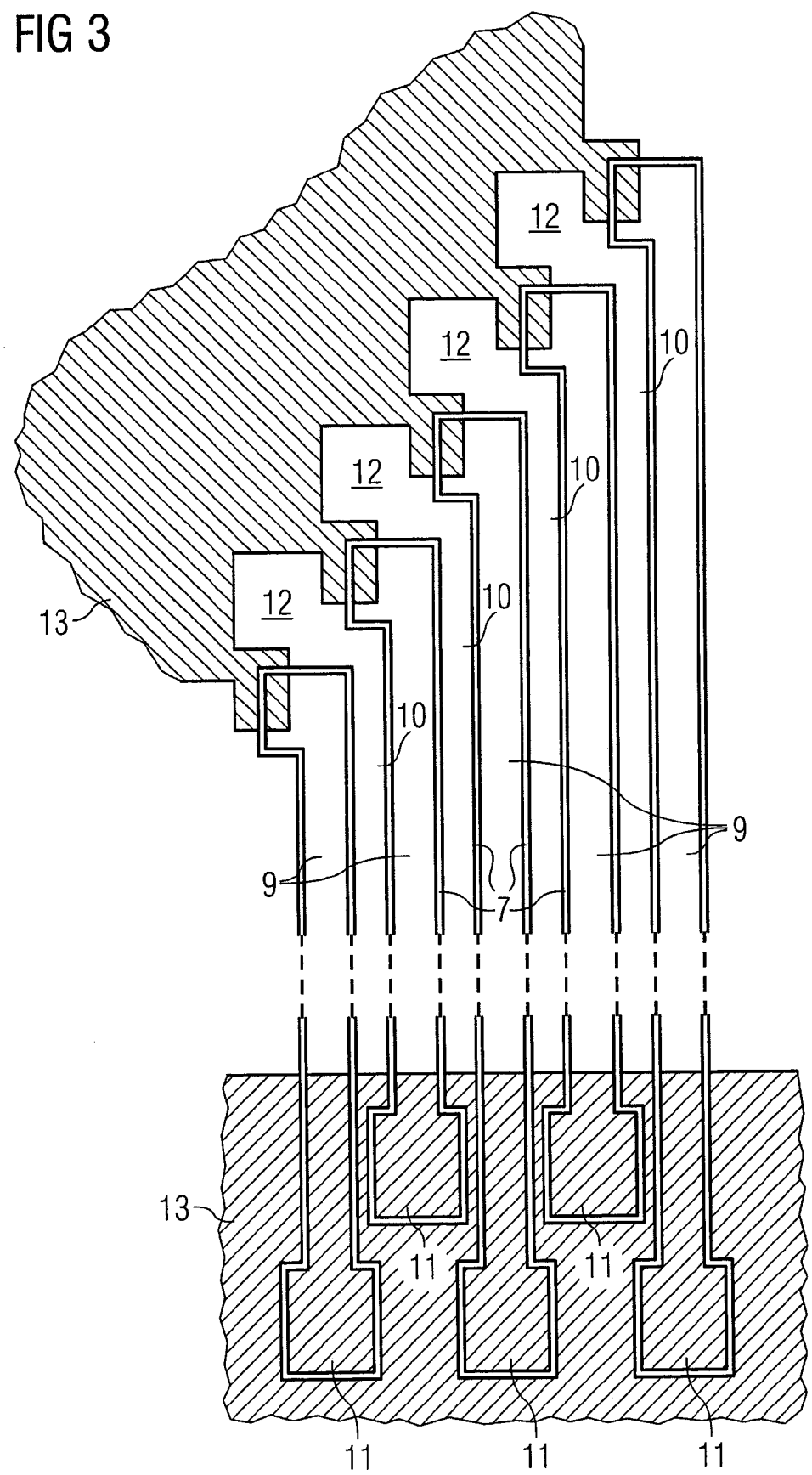
FIG. 3 shows a plan view onto an exemplary embodiment, showing the structure of the word line stacks and of a further mask.

The following reference numerals can be used in conjunction with the drawings:
1 substrate
2 first word line layer
3 hard mask layer
4 anti-reflection coating
5 resist mask
6 word line stack
7 liner
8 dielectric material
9 first word line
10 interspace
11 first contact area
12 second contact area
13 mask
14 third contact area
15 dielectric layer
16 second word line layer
17 second word line

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Preferred examples of the semiconductor memory device are described in conjunction with the figures with reference to the production steps of a preferred production method. The conductor tracks are provided as word lines in this example.

FIG. 1 shows a cross-section of a first intermediate product. A first word line layer 2 and a hard mask 3 are applied on a main surface of a semiconductor body 1, such as a substrate. The first word line layer 2 can be a layer sequence, typically formed of a first layer of doped polysilicon, followed by a second layer of metal or metal silicide to reduce the track resistance. A thin anti-reflection coating 4 is preferably applied before a resist mask 5 is applied and structured according to the structure of the word line stacks that are to be produced. The resist mask 5 is used to copy the structure into the hard mask layer 3. The part of the device that comprises the memory cell array is shown on the left side of FIG. 1. The right side of FIG. 1 shows the area of an edge or margin of the memory cell array, where contact areas are to be located.

After it is structured, the hard mask is used to etch word line stacks 6 shown in FIG. 2 in cross-section. The word line stacks 6 have a strip-like shape, whose longitudinal extension is perpendicular to the drawing plane of FIG. 2. The whole surface is then preferably covered with a thin liner 7, which may be, for example, silicon nitride (e.g., $Si_3N_4$). A dielectric material 8 is then deposited, preferably as tetra-ethylorthosilicate (TEOS), which fills the gaps between the word line stacks 6 and which is provided to form a blocking layer. The surface is planarized to the level shown by the broken horizontal line in FIG. 2. The word line stacks 6 function as etch stop.

FIG. 3 shows a plan view onto the device after the production of the word line stacks forming first word lines 9 with interspaces 10. The lateral dimension of the word line stacks is preferably adjusted so that the interspaces 10 are slightly wider than the first word lines 9, in order to allow the deposition of an additional lateral electric insulation reinforcing the liner 7, thus rendering the interspaces to have at least approximately the same width as the word line stacks. The word lines run across the memory cell array, which is not shown in detail, between final sections that are located on two opposite edges of the array. At least on one of the edges, the first word lines 9 are provided with first contact areas 11. The first contact areas 11 have a larger lateral dimension than the word lines themselves. They are staggered in the direction of the longitudinal extension of the word lines so that the area between next but one word lines is provided for the first contact areas 11.

On the opposite edge, shown on the top of FIG. 3, the final sections of the first word lines 9 comprise lateral dimensions exceeding the width of the word lines. The broader parts of the final sections are staggered in the direction of the longitudinal extension of the first word lines in the steady fashion shown in FIG. 3, thus forming an arrangement in the form of a fan or harp.

After the interspaces 10 have been filled with the dielectric material 8, and the surface has been planarized to the level of the upper surfaces of the first word line stacks, a further mask 13 is applied to the surface and structured in the form shown in FIG. 3. The mask is indicated by the hatching. In the described example, the first contact areas 11 are covered by the mask 13. On the opposite edge, the mask 13 covers only portions of the broader final sections of the word line stacks. Second contact areas 12 that are provided for second word lines are left free by the mask 13 in regions that are adjacent to the final sections of the first word lines and are extensions of the interspaces 10. The second word lines are to be formed in the interspaces 10 and provided with contact areas in the final sections of the interspaces, which are shown as second contact areas 12 in FIG. 3.

Figure 4:
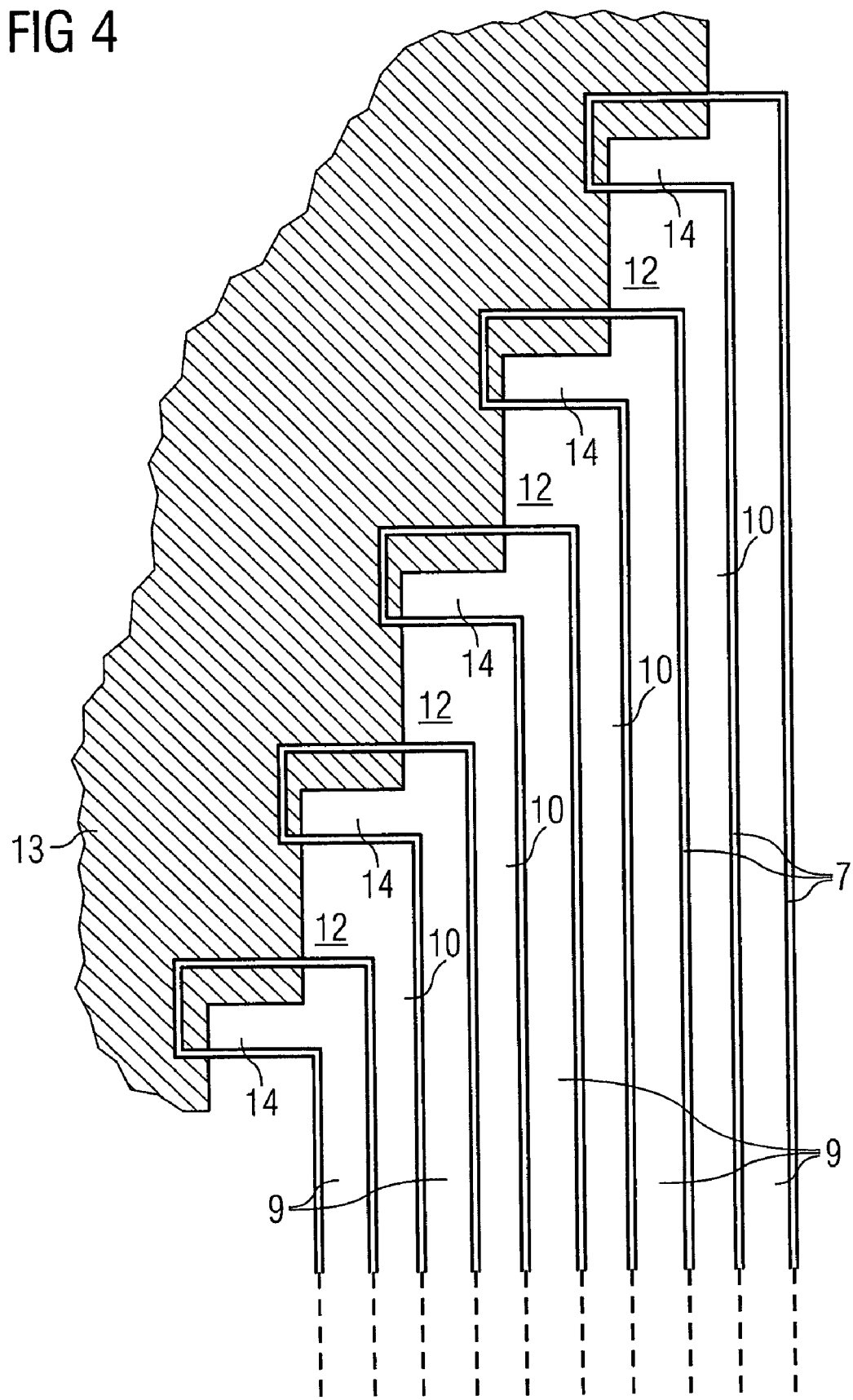
FIG. 4 shows the plan view according to FIG. 3 of a further exemplary embodiment.

FIG. 4 shows the edge of the array that is represented on top of FIG. 3 of a further embodiment, in which the first word lines 9 also comprise contact areas on this edge, indicated in FIG. 4 as third contact areas 14. These are formed by larger final sections of the first word lines, which preferably extend to corresponding sides of the first word lines 9 in the manner shown in FIG. 4. In this example, the second contact areas 12 can be designed to be laterally limited on three sides by the first word lines and their contact areas (here designated as third contact areas 14). It is further possible to provide staggered final sections similar to the arrangement shown in FIG. 4 also on the opposite edge of the array. In this way, it is possible to provide every word line with contact areas on both ends. Instead, all the contact areas of all the word lines can be provided on only one of the opposite edges.

The embodiment according to FIG. 4 requires a slightly larger device area than the embodiment according to FIG. 3. The final sections of the word lines can further be modified according to the required special shape of the contact areas. They are arranged so that they fan out principally according to the shape shown in FIGS. 3 and 4.

The dielectric material 8 is removed in the regions of the openings of the mask 13 to form a blocking layer of the remaining portions of the dielectric material 8. The outer regions are left covered by the mask 13 so that the dielectric material 8 remains on those portions of the surface, especially on peripheral areas of the device. A subsequent dry etching step removes the liner 7 on the upper surface of the word line stacks and from the main surface of the substrate between the word line stacks. In this way, sidewall spacers to the word line stacks are formed by the remaining parts of the liner 7.

Figure 5:
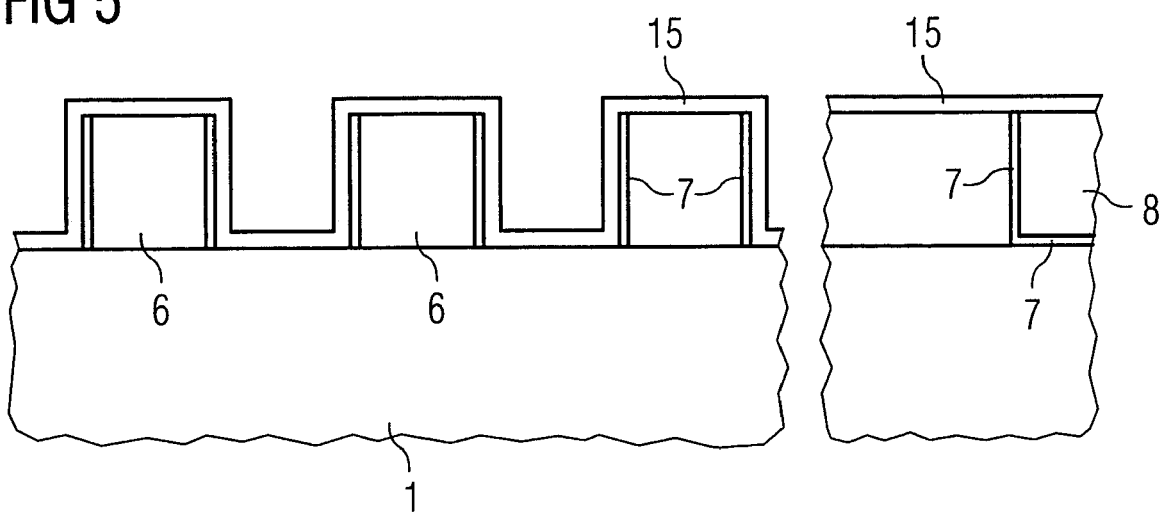
FIG. 5 shows the cross-section according to FIG. 2 after the deposition of another dielectric layer.

As shown in FIG. 5, a further layer is preferably applied to improve the lateral electric insulation of the word line stacks, for example by the deposition of an additional dielectric layer 15. This layer reinforces the spacers formed by the liner 7 and replaces oxide or other dielectric material on the upper surfaces that has been consumed in the preceding process steps.

Figure 6:
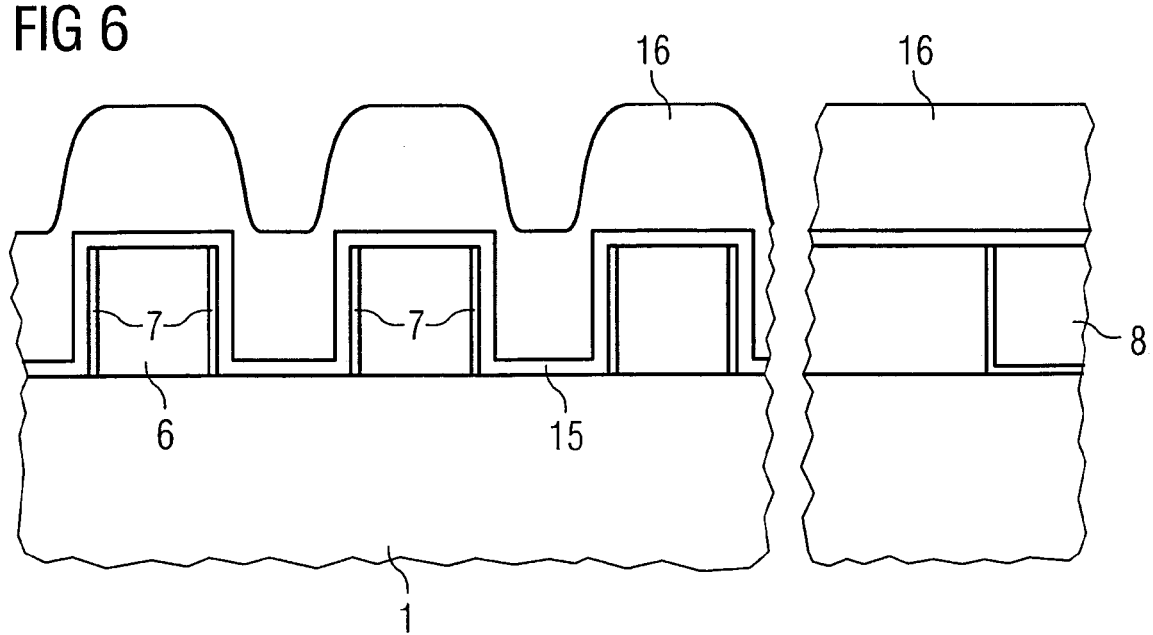
FIG. 6 shows the cross-section according to FIG. 5 after the deposition of a second word line layer.

FIG. 6 shows the cross-section according to FIG. 5 after the deposition of a second word line layer 16, which fills the interspaces between the word line stacks 6. The interspaces between the word line stacks 6 are limited by the blocking layer.

Figure 7:
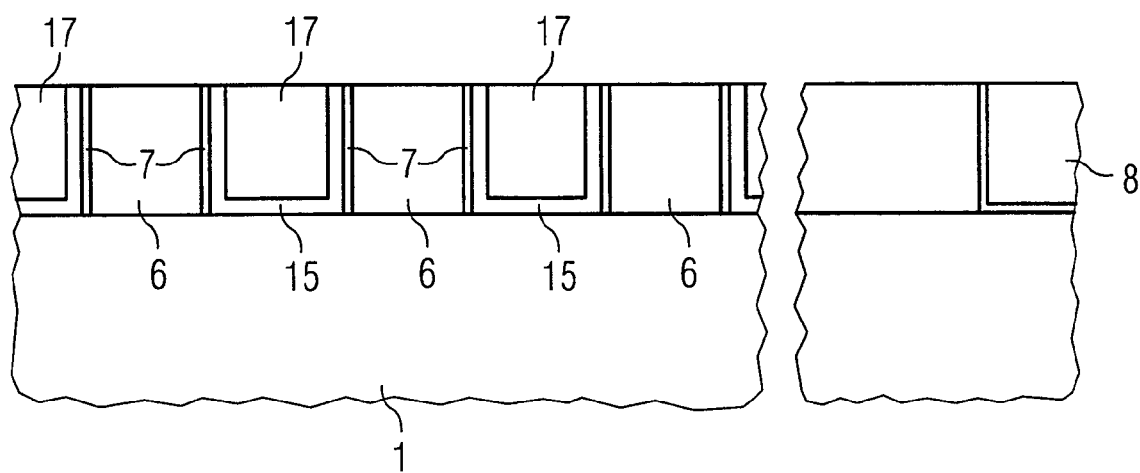
FIG. 7 shows the cross-section according to FIG. 6 after the planarization of the stack of the second word lines.

The upper surface is again planarized so that the product shown in cross-section in FIG. 7 is obtained. The second word lines 17 are arranged between the word line stacks 6 of the first word lines and electrically insulated from the first word lines by the liner spacers and the residual additional dielectric layer 15. The final sections of the second word lines 17 are formed in the shape of the second contact areas 12, according to the openings of the mask 13 shown in FIGS. 3 and 4, and according to the resulting shape of the blocking layer. In this way, the second word lines 17 are provided with sufficiently large contact areas. The electric contacts provided for the electric connection of the word lines are applied to the contact areas in subsequent process steps.

Although the present invention and its advantages have been described in detail, it should be understood that various changes, substitutions and alterations can be made herein without departing from the spirit and scope of the invention as defined by the appended claims.

What is claimed is:

1. A method of making a semiconductor memory device, the method comprising:

providing a semiconductor body having a main surface;

providing an array of memory cells at said surface, said array having edges;

arranging a first plurality of parallel conductor tracks over said main surface across said array, said conductor tracks being separated by interspaces and provided with contact areas on one of said edges of the memory cell array;

forming a blocking layer over said surface, said blocking layer having an opening that delimits an area provided for a second plurality of parallel conductor tracks that are to be arranged in said interspaces and for contact areas of said second plurality on one of said edges of the memory cell array;

applying lateral insulations to said first plurality of conductor tracks; and applying an electrically conductive material into said opening to form said second plurality of conductor tracks and contact areas.

2. The method according to claim 1, wherein arranging a first plurality of parallel conductor tracks over said main surface comprises forming said conductor tracks of said first plurality with a longitudinal extension and with ends on one edge of said memory cell array, said ends being arranged in staggered fashion so that they are successively located at an increasing distance from the memory cell array; and wherein said opening of said blocking layer is formed to encompass areas that are laterally adjacent to said ends of said conductor tracks of said first plurality, with respect to said longitudinal extension of said conductor tracks, said laterally adjacent areas being provided as contact areas of said conductor tracks of said second plurality.

3. The method according to claim 2, wherein:

said ends of said conductor tracks of said first plurality are formed with lateral extensions that are located at increasing distance from the memory cell array, when taken in their succession from one conductor track of said first plurality to the next conductor track of said first plurality; and said contact areas of said conductor tracks of said second plurality are arranged between said lateral extensions.

4. The method according to claim 3, wherein said lateral extensions of said ends of the conductor tracks of said first plurality are provided as contact areas of the conductor tracks of said first plurality.

5. The method according to claim 2, wherein:

said conductor tracks of said first plurality are formed with further ends on a further edge of said memory cell array that is opposite to said one edge;

said further ends are arranged in staggered fashion so that they are successively located at an increasing distance from the memory cell array; and said further ends are provided with further lateral extensions to form said contact areas of said conductor tracks of said first plurality.

6. The method according to claim 5, wherein forming a blocking layer comprises forming said blocking layer from tetraethylorthosilicate (TEOS).

7. The method according to claim 1, wherein forming a blocking layer comprises forming said blocking layer from tetraethylorthosilicate (TEOS).

8. A method of making a semiconductor memory device, the method comprising:

providing an array of memory cells at a main surface of a semiconductor body;

arranging a first plurality of conductor tracks with longitudinal extensions and lateral dimensions, said conductor tracks running parallel at a distance from one another across said array on said surface and being separated by interspaces, said conductor tracks having final sections with lateral dimensions that exceed said lateral dimensions of said conductor tracks and are arranged to be staggered in the direction of said longitudinal extensions;

applying a dielectric material and thereby filling said interspaces between said conductor tracks;

planarizing said dielectric material to a top level of said conductor tracks;

applying a mask that partially covers said final sections, leaving said conductor tracks and said interspaces uncovered, as well as areas that are adjacent to said final sections and to final sections of said interspaces;

removing said dielectric material in the areas that are left uncovered by said mask;

applying a lateral electric insulation to said first plurality of conductor tracks; and filling a material provided for a second plurality of conductor tracks into said interspaces and into said areas adjacent to said final sections of said interspaces, wherein said final sections of said interspaces have dimensions that are suitable for contact areas.

9. The method according to claim 8, wherein said final sections of said conductor tracks are formed to have dimensions that are suitable for contact areas.

10. The method according to claim 9, wherein said arrangement of final sections of said conductor tracks is formed on both ends of said conductor tracks and wherein the final sections of said interspaces between said conductor tracks on both ends of said conductor tracks have dimensions that are suitable for contact areas.

11. Semiconductor memory device, comprising:

a semiconductor body having a main surface;

an array of memory cells arranged at said main surface, said array having edges; and conductor tracks arranged across said array and being provided to address said memory cells, wherein:

said conductor tracks have a longitudinal extension and a lateral dimension in said surface and are separated from one another by dielectric material;

said conductor tracks are provided with contact areas having a dimension transversely to said longitudinal extension that is larger than said lateral dimension;

said conductor tracks are subdivided into pluralities that comprise every next but one conductor track;

said contact areas of the conductor tracks of the same plurality are located on the same edge of the memory cell array; and said contact areas of the conductor tracks of at least one of said pluralities are arranged in a staggered fashion in the direction of said longitudinal extension.

12. The semiconductor memory device according to claim 11, wherein said contact areas that are arranged in a staggered fashion are located at increasing distance from the memory cell array, when taken in their succession from one conductor track of the relevant plurality to the next conductor track of said plurality.

13. The semiconductor memory device according to claim 11, wherein said contact areas of said at least one plurality are shifted in a direction transverse to said longitudinal extension out of an area that is defined by a straight prolongation of the area of the pertaining conductor track in the direction of said longitudinal extension.

14. The semiconductor memory device according to claim 11, wherein the conductor tracks are arranged in parallel across the array.

15. The semiconductor memory device according to claim 11, wherein the conductor tracks comprise word lines.

16. The semiconductor memory device according to claim 11, wherein one of said pluralities of conductor tracks comprises contact areas on one edge of the memory cell array and another one of said pluralities of conductor tracks comprises contact areas on an opposite edge of the memory cell array.

17. The semiconductor memory device according to claim 16, wherein said contact areas of each of said pluralities are arranged in a staggered fashion so that the contact areas of the same plurality are successively located at an increasing distance from the memory cell array.

18. The semiconductor memory device according to claim 16, wherein:
said conductor tracks of a first plurality each comprise an end that is provided with one of said contact areas on said one edge of the memory cell array and an opposite end that is located on said opposite edge of the memory cell array;
said opposite ends are arranged in staggered fashion so that they are successively located at an increasing distance from the memory cell array;
contact areas of said conductor tracks of a second one of said pluralities are arranged on said opposite edge and in a staggered fashion according to the staggered arrangement of the opposite ends of the conductor tracks of the first plurality; and
said contact areas of said conductor tracks of said second plurality being shifted in a direction transverse to said longitudinal extension of said conductor tracks out of an area that is defined by a straight prolongation of the area of the pertaining conductor track of the second plurality in the direction of said longitudinal extension.

19. The semiconductor memory device according to claim 18, wherein said opposite ends of the conductor tracks of said first plurality comprising lateral extensions in the direction in which said contact areas of the conductor tracks of said second plurality are shifted out of said area defined by a straight prolongation of the area of the pertaining conductor track.

20. The semiconductor memory device according to claim 11, wherein:
each of said pluralities of conductor tracks comprise contact areas on the same edge of the memory cell array;
said contact areas of the conductor tracks of a first plurality are arranged in staggered fashion so that they are successively located at an increasing distance from the memory cell array;
said contact areas of the conductor tracks of a second plurality are also arranged in a staggered fashion according to the staggered arrangement of the contact areas of the conductor tracks of the first plurality; and
said contact areas of said conductor tracks of both pluralities are shifted in a direction transverse to said longitudinal extension of said conductor tracks out of an area that is defined by a straight prolongation of the area of the pertaining conductor track in the direction of said longitudinal extension.

21. The semiconductor memory device according to claim 20, wherein:
said contact areas of the conductor tracks of the second plurality are arranged over an area that is defined by a straight prolongation of the area of a neighboring conductor track of the first plurality in the direction of said longitudinal extension; and
said contact areas of the conductor tracks of the first plurality are arranged over an area that is defined by a straight prolongation of the area of a neighboring conductor track of the second plurality in the direction of said longitudinal extension.

* * * * *